United States Patent
Almen et al.

(10) Patent No.: US 9,243,164 B1
(45) Date of Patent: *Jan. 26, 2016

(54) THERMOSETTING RESIN COMPOSITION CONTAINING A POLYPHENYLENE ETHER AND A BROMINATED FIRE RETARDANT COMPOUND

(71) Applicant: Park Electrochemical Corporation, Melville, NY (US)

(72) Inventors: Gregory Roy Almen, Mesa, AZ (US); Ke Wang, Chandler, AZ (US); Qiang Yuan, Chandler, AZ (US)

(73) Assignee: Park Electrochemical Corporation, Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/599,135

(22) Filed: Jan. 16, 2015

Related U.S. Application Data

(63) Continuation-in-part of application No. 13/773,375, filed on Feb. 21, 2013, now Pat. No. 9,051,465.

(60) Provisional application No. 61/601,483, filed on Feb. 21, 2012.

(51) Int. Cl.
| | |
|---|---|
| C09D 171/12 | (2006.01) |
| C08K 5/03 | (2006.01) |
| C08K 3/36 | (2006.01) |
| C08J 5/24 | (2006.01) |
| B32B 5/02 | (2006.01) |
| B32B 15/14 | (2006.01) |
| B32B 15/20 | (2006.01) |

(52) U.S. Cl.
CPC .............. *C09D 171/12* (2013.01); *B32B 5/022* (2013.01); *B32B 5/024* (2013.01); *B32B 15/14* (2013.01); *B32B 15/20* (2013.01); *C08J 5/24* (2013.01); *C08K 3/36* (2013.01); *C08K 5/03* (2013.01); *B32B 2250/02* (2013.01); *B32B 2255/02* (2013.01); *B32B 2307/3065* (2013.01); *B32B 2311/12* (2013.01); *B32B 2457/08* (2013.01); *C08J 2371/12* (2013.01)

(58) Field of Classification Search
USPC ........................... 442/136; 428/901, 209, 457
See application file for complete search history.

(56) References Cited

U.S. PATENT DOCUMENTS

| | | |
|---|---|---|
| 4,912,172 A | 3/1990 | Hallgren et al. |
| 5,124,415 A | 6/1992 | Sakamoto et al. |
| 5,160,781 A | 11/1992 | Yoshioka et al. |
| 5,275,878 A | 1/1994 | Yamakawa et al. |
| 5,352,745 A | 10/1994 | Kayayose et al. |
| 6,306,963 B1 | 10/2001 | Lane et al. |
| 6,451,931 B1 | 9/2002 | Ogawa et al. |
| 6,455,784 B1 | 9/2002 | Kinoshita et al. |
| 6,469,081 B1 | 10/2002 | Chino et al. |
| 6,589,656 B2 | 7/2003 | Maekawa et al. |
| 7,226,981 B2 | 6/2007 | Fujita et al. |
| 7,288,587 B2 | 10/2007 | Saitou et al. |
| 7,329,708 B2 | 2/2008 | Birsak et al. |
| 7,341,783 B2 | 3/2008 | Tokiwa |
| 7,413,791 B2 | 8/2008 | Inoue et al. |
| 7,414,093 B2 | 8/2008 | Kubo et al. |
| 7,439,310 B2 | 10/2008 | Tokiwa et al. |
| 7,527,863 B2 | 5/2009 | Tokiwa |
| 7,820,772 B2 | 10/2010 | Ushi et al. |
| 7,838,576 B2 | 11/2010 | Inoue et al. |
| 7,854,860 B2 | 12/2010 | Kondo et al. |

(Continued)

FOREIGN PATENT DOCUMENTS

| | | |
|---|---|---|
| AU | 2011376206 | 2/2014 |
| CN | 102585480 | 7/2012 |
| CN | 102807658 | 12/2012 |
| CN | 102850766 | 1/2013 |
| CN | 103443159 | 12/2013 |
| EP | 0441441 | 12/1996 |
| EP | 1377638 | 1/2004 |
| EP | 1592747 | 11/2005 |
| EP | 2194098 | 6/2010 |
| EP | 2595460 | 5/2013 |

(Continued)

OTHER PUBLICATIONS

Peters et al., Polyphenylene Ether Macromolecules. VI. Halogen Free Flame Retardant Epoxy Resins, Sabic Innovative Plastics, IPC APEX EXPO Mar. 31, 2009, Presentation, 52 pages.

(Continued)

*Primary Examiner* — Lynda Salvatore
(74) *Attorney, Agent, or Firm* — Fish & Richardson P.C.

(57) ABSTRACT

A resin composition for use in making pre-pregs and structural laminates contains a functionalized poly(phenylene ether) having the structure below:

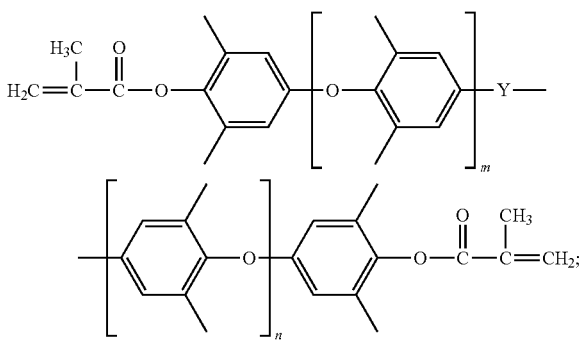

a radical initiator, the radical initiator being from about 0.1% to about 0.5% by weight of the composition; an unsaturated monomer; and a flame retardant comprising the compound 1,1'(ethane-1,2-diyl)bis[pentabromobenzene]. In the above structure, Y, m and n are defined in the Specification.

22 Claims, No Drawings

(56) References Cited

U.S. PATENT DOCUMENTS

| | | |
|---|---|---|
| 7,858,726 B2 | 12/2010 | Onizuka et al. |
| 7,924,660 B2 | 4/2011 | Schuller |
| 7,927,514 B2 | 4/2011 | Kondo et al. |
| 8,053,077 B2 | 11/2011 | Braidwood et al. |
| 8,257,820 B2 | 9/2012 | Paul |
| 8,335,148 B2 | 12/2012 | Arishima et al. |
| 8,446,707 B1 | 5/2013 | Das et al. |
| 8,632,874 B2 | 1/2014 | Paul et al. |
| 8,703,277 B2 | 4/2014 | Tokiwa et al. |
| 8,722,192 B2 | 5/2014 | Paul |
| 9,051,465 B1 * | 6/2015 | Almen .................. C08L 71/126 |
| 2004/0146692 A1 | 7/2004 | Inoue et al. |
| 2006/0173101 A1 | 8/2006 | Takahata et al. |
| 2006/0178542 A1 | 8/2006 | Ued et al. |
| 2007/0093614 A1 | 4/2007 | Uchida et al. |
| 2007/0191540 A1 | 8/2007 | Nunoshige et al. |
| 2008/0071033 A1 | 3/2008 | Sugiyama |
| 2008/0254257 A1 | 10/2008 | Inoue et al. |
| 2009/0030175 A1 | 1/2009 | Yamamoto et al. |
| 2009/0247032 A1 | 10/2009 | Mon et al. |
| 2012/0006588 A1 | 1/2012 | Kakiuchi et al. |
| 2013/0059127 A1 | 3/2013 | Peters |
| 2013/0075138 A1 | 3/2013 | Yu et al. |
| 2013/0209802 A1 | 8/2013 | Maraki et al. |
| 2013/0252003 A1 | 9/2013 | Liu |
| 2013/0284358 A1 | 10/2013 | He et al. |
| 2014/0004324 A1 | 1/2014 | Hsieh |
| 2014/0011962 A1 | 1/2014 | He et al. |
| 2014/0024278 A1 | 1/2014 | He et al. |
| 2014/0058014 A1 | 2/2014 | Peters |
| 2014/0107350 A1 | 4/2014 | Nakamura et al. |
| 2014/0127462 A1 | 5/2014 | Endo et al. |
| 2014/0182903 A1 | 7/2014 | Sagara et al. |
| 2014/0255711 A1 | 9/2014 | Chen et al. |

FOREIGN PATENT DOCUMENTS

| | | |
|---|---|---|
| EP | 2640174 | 9/2013 |
| EP | 2723797 | 4/2014 |
| GB | 2172892 | 10/1986 |
| JP | 02120357 | 5/1990 |
| JP | 1992021438 | 1/1992 |
| JP | 1992161454 | 6/1992 |
| JP | 1996231847 | 9/1996 |
| JP | 1997290481 | 11/1997 |
| JP | 2000104038 | 4/2000 |
| JP | 2001001357 | 1/2001 |
| JP | 2001151885 | 6/2001 |
| JP | 2001298275 | 10/2001 |
| JP | 2002088522 | 3/2002 |
| JP | 2002105308 | 4/2002 |
| JP | 2003034731 | 2/2003 |
| JP | 2003160662 | 6/2003 |
| JP | 2003160726 | 6/2003 |
| JP | 2003183385 | 7/2003 |
| JP | 2003221503 | 8/2003 |
| JP | 2003283098 | 10/2003 |
| JP | 2004165519 | 6/2004 |
| JP | 2004214597 | 7/2004 |
| JP | 2004231781 | 8/2004 |
| JP | 2004259899 | 9/2004 |
| JP | 2004263099 | 9/2004 |
| JP | 2005015613 | 1/2005 |
| JP | 2005290124 | 10/2005 |
| JP | 2006093690 | 4/2006 |
| JP | 2006516297 | 6/2006 |
| JP | 2006206689 | 8/2006 |
| JP | 2006232952 | 9/2006 |
| JP | 2007030326 | 2/2007 |
| JP | 2007056170 | 3/2007 |
| JP | 2007302876 | 11/2007 |
| JP | 2008050526 | 3/2008 |
| JP | 2008127451 | 6/2008 |
| JP | 2008260942 | 10/2008 |
| JP | 2009029928 | 2/2009 |
| JP | 2009073996 | 4/2009 |
| JP | 2009078209 | 4/2009 |
| JP | 5465854 | 3/2010 |
| JP | 2010053178 | 3/2010 |
| JP | 2010053179 | 3/2010 |
| JP | 2010059363 | 3/2010 |
| JP | 2010222408 | 10/2010 |
| JP | 2010275341 | 12/2010 |
| JP | 2010275342 | 12/2010 |
| JP | 2011046815 | 3/2011 |
| JP | 2011046816 | 3/2011 |
| JP | 2011052165 | 3/2011 |
| JP | 2011074124 | 4/2011 |
| JP | 2012092195 | 5/2012 |
| JP | 2012126844 | 7/2012 |
| JP | 2014001274 | 7/2012 |
| JP | 2012197336 | 10/2012 |
| JP | 2012241168 | 12/2012 |
| JP | 2013-23517 | 2/2013 |
| JP | 2013023517 | 2/2013 |
| JP | 2013151638 | 8/2013 |
| JP | 2013194137 | 9/2013 |
| JP | 2013194138 | 9/2013 |
| JP | 2013245287 | 12/2013 |
| JP | 2014001276 | 1/2014 |
| JP | 2014001277 | 1/2014 |
| JP | 2014019740 | 2/2014 |
| KR | 20100044231 | 4/2010 |
| SG | 194575 | 12/2013 |
| TW | 1363770 | 8/2007 |
| TW | 201231553 | 8/2012 |
| TW | 201311817 | 3/2013 |
| TW | 201336919 | 9/2013 |
| TW | 1412564 | 10/2013 |
| TW | 201343784 | 11/2013 |
| TW | 1422644 | 1/2014 |
| WO | WO 2007096945 | 8/2007 |
| WO | WO 2007097196 | 8/2007 |
| WO | WO 2008033611 | 3/2008 |
| WO | WO 2009040921 | 4/2009 |
| WO | WO 2009041137 | 4/2009 |
| WO | WO 2010097261 | 4/2011 |
| WO | WO 2012011677 | 1/2012 |
| WO | WO 2012098734 | 7/2012 |
| WO | WO 2013002962 | 1/2013 |
| WO | WO 2013097133 | 4/2013 |
| WO | WO 2013097128 | 7/2013 |
| WO | WO 2013108890 | 7/2013 |
| WO | WO 2013141298 | 9/2013 |
| WO | WO 2013154133 | 10/2013 |
| WO | WO 2013179778 | 12/2013 |
| WO | WO 2014021386 | 2/2014 |
| WO | WO 2014034103 | 3/2014 |
| WO | WO 2014082386 | 6/2014 |

OTHER PUBLICATIONS

Peters et al., Polyphenylene ether macromonomer. Viii. Low Z-Axis Cte, Low $D_1$ Epoxy Laminates, Sabic Innovative Plastics, IPC APEX EXPO, Apr. 12, 2011, Presentation 39 pages.

Peters et al., Polyphenylene ether macromonomer: X. Vinyl terminated telechelic macromers, Annu Tech Conf ANTEC Conf Proc, May 1, 2011, vol. 3, pp. 2819-2822.

Peters et al., Polyphenylene ether macromonomers—III—enhancement of dielectric materials, Sabic Innovative Plastics, IPC APEX EXPO Presentation, Mar. 31, 2009, 41 pages.

Peters et al., Polyphenylene ether macromonomers. I. Property Enhancements in thermoset resins via novel telechelic oligomers, Society of Plastics Engineers Annual Technical Conference, ANTEC-0104-2007, May 6, 2007, manuscript 4 pages.

Peters et al., Polyphenylene ether macromonomers. II. Property Enhancements in cyanate ester resins, Society of Plastics Engineers Annual Technical Conference, NPE 2009 International Plastics Showcase Jun. 22, 2009, manuscript 4 pages.

Peters et al., Polyphenylene ether macromonomers. III. Enhancements of dielectric materials, IPC Printed Circuits EXPO and APEX Mar. 31, 2009 Article, 11 pages.

(56) References Cited

OTHER PUBLICATIONS

Peters et al., Polyphenylene ether macromonomers. VII. Performance in t-Butyl Styrene/Divinyl Benzene Resin System, ANTEC 2010—Proceedings of the 68$^{th}$ Annual Technical Conference & Exhibition, Society of Plastics Engineers, pp. 1858-1861, May 31, 2011.

Peters et al., PPE macromonomers. IX. Performance enhancements of triallyl isocyamurate resins, Annu Tech Conf ANTEC Conf Proc, May 1, 2011, vol. 3, pp. 2823-2826.

Peters et al., PPE macromonomers. IX. Performance enhancements of triallyl isocyanurate resins, Sabic Innovative Plastics, ANTEC 2011, May 1, 2011, Article, pp. 2823-2826.

* cited by examiner

THERMOSETTING RESIN COMPOSITION CONTAINING A POLYPHENYLENE ETHER AND A BROMINATED FIRE RETARDANT COMPOUND

CROSS-REFERENCE TO RELATED APPLICATIONS

This application is a continuation-in-part of U.S. Utility application Ser. No. 13/773,375, filed Feb. 21, 2013, now U.S. Pat. No. 9,051,465 which claims priority from U.S. Provisional Application Ser. No. 61/601,483, filed Feb. 21, 2012. The contents of these applications are incorporated by reference herein.

FIELD OF THE INVENTION

The present invention generally relates to a curable resin composition, a cured resin composition, a sheet-like cured resin, a laminated body, a prepreg, electronic parts, single and multilayer circuit boards comprising a poly(phenylene ether) resin composition, for use, e.g., in single and multilayer printed circuit boards.

SUMMARY OF THE INVENTION

The novel curable compositions of the present invention include a functionalized poly(phenylene ether) having the structure:

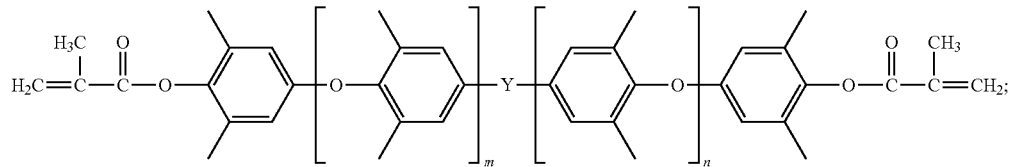

a radical initiator; an unsaturated monomer; and a flame retardant comprising the compound 1,1'(ethane-1,2-diyl)bis[pentabromobenzene], wherein Y, m and n are defined herein.

Other embodiments of the present invention are a cured resin, a sheet-like cured resin, a laminated body, a prepreg, electronic parts, and single and multilayer circuit boards comprising the novel curable compositions of the present invention.

DETAILED DESCRIPTION OF THE INVENTION

Curable compositions including functionalized poly(phenylene ether) and copolymerizable monomer compositions are known for a wide variety of thermoset applications. However, there is an ongoing need for formulations that achieve a balance of properties useful for thermoset compositions.

The present invention provides curable compositions useful for the preparation of prepregs and laminates exhibiting desirable characteristics such as high interlaminar bond strength, robust thermal stability, good process ability, good moisture resistance, excellent dielectric properties, very low thermal expansion, and high reliability. These compositions are useful for various applications, including the preparation of single and multilayer printed circuit boards.

In one embodiment, the invention provides a curable composition comprising a functionalized poly(phenylene ether) resin. As used herein, a "functionalized" poly(phenylene ether) is a poly(phenylene ether) that is "capped," having a polymerizable carbon-carbon double bond at each end of the molecule. One method of preparing such molecules is to first prepare a poly(phenylene ether) having a hydroxy group at each end of the molecule (e.g., a "dihydroxy poly(phenylene ether)"), then react the dihydroxy poly(phenylene ether) with sufficient capping reagent to form polymerizable capping groups at each end of the molecule.

For example, in one embodiment, a functionalized poly (phenylene ether) of the invention has the structure:

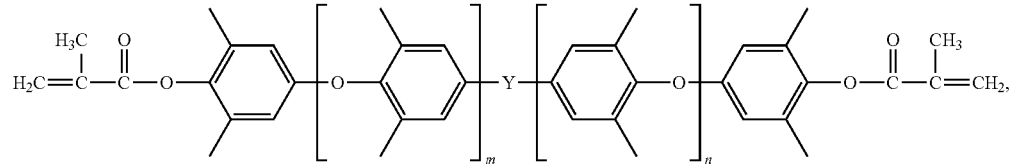

wherein m and n are independently 1 to 500; and Y is absent or has the structure:

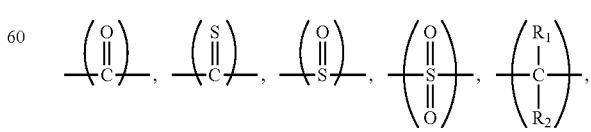

where $R_1$ and $R_2$ are each independently hydrogen or $C_1$-$C_{12}$ alkyl, or the like.

In one preferred embodiment of the invention, m and n independently represent integers in the range of 1 to 100. In another preferred embodiment, m and n represent integers in the range of 1 to 50. In another preferred embodiment, Y is absent. In yet another preferred embodiment, Y is an isopropylidene group. In another preferred embodiment, the poly (phenylene ether) is MX9000-111 or SA9000-111 (Sabic).

The curable composition may comprise about 10 to about 60 percent by weight of the functionalized poly(phenylene ether). As used herein, the term "percentage by weight" is determined based on the non-solvent portion of the materials in the curable composition. Within this range, the amount of the functionalized poly(phenylene ether) may be about 15, 20, 25, 30, 35 or about 40 percent by weight of the curable composition. In one embodiment, the functionalized poly (phenylene ether) polymer is present in the composition in an amount of about 30 to about 60 percent by weight. In another embodiment, the poly(phenylene ether) is present in an amount of about 30 to about 50 percent by weight. In another embodiment, the poly(phenylene ether) is present in an amount of about 10 to about 50 percent by weight (e.g., about 15 to about 45 percent by weight or about 20 to about 40 percent by weight) of the curable composition. In another embodiment, the poly(phenylene ether) is present in an amount of about 10 to about 40 percent by weight (e.g., about 20 to about 35 percent by weight or about 25 to about 30 percent by weight) of the curable composition. In another embodiment, the poly(phenylene ether) is present in an amount of about 40 percent by weight. In yet another embodiment of the invention, the functionalized poly(phenylene ether) is present in the composition at about 27 or 37 percent by weight of the composition.

In addition to the functionalized poly(phenyl ether), the curable composition is combined with a flame retardant. Flame retardant compounds useful in this invention include, e.g., halogenated flame retardants, more specifically, brominated flame retardants. Brominated flame retardants of the invention may comprise the compound 1,1'(ethane-1,2-diyl) bis[pentabromobenzene], and derivatives thereof. An example of a preferred flame retardant of the invention is the commercial product Saytex® 8010 (Albemarle®). The flame retardant is advantageously present in an amount within the range of about 5 to about 60 percent by weight of the composition. In one embodiment of the invention, the flame retardant is present in an amount of about 10 to about 60 percent by weight (e.g., about 10 to about 50 percent by weight, about 10 to about 40 percent by weight, about 10 to about 30 percent by weight, or about 10 to about 20 percent by weight) of the composition. In one embodiment of the invention, the flame retardant is present in an amount of about 5 to about 50 percent by weight (e.g., about 5 to about 20 percent by weight, about 5 to 15 percent by weight, or about 10 to 15 percent by weight) of the composition. In another embodiment, the flame retardant is present in an amount of about 20 percent by weight. In a preferred embodiment, the flame retardant is present in an amount of about 14 or 18 percent per weight of the composition.

The curable composition may also comprise one or more unsaturated monomers. As used herein, the term "unsaturated monomer" is a polymerizable monomer comprising a carbon-carbon double bond. In one embodiment of the invention, the unsaturated monomer is a mono- or poly-functional acrylate or methacrylate ester. In this embodiment, the unsaturated monomer may comprise bisphenol A diacrylate or dimethacrylate, ethoxylated bisphenol A diacrylate, available as the commercial product SR-349 (Sartomer), ethoxylated bisphenol A dimethacrylate, available as the commercial product SR-348 (Sartomer) and trimethylolpropane trimethacrylate, available as the commercial product SR-350 (Sartomer). In another embodiment, the unsaturated monomer is a bismaleimide (e.g., MDA-BMI, TDA-BMI).

In another preferred embodiment of the invention, the unsaturated monomer is an allylic monomer. An allylic monomer includes any organic compound comprising at least one allyl ($-CH_2-CH=CH_2$) group. In one embodiment, the allylic monomer comprises at least two allyl groups. In another embodiment, the allylic monomer comprises at least three allyl groups. Suitable allylic monomers of the invention include, e.g., diallyl phthalate, diallyl isophthalate, triallyl mellitate, triallyl mesate, triallyl benzenes, triallyl cyanurate, triallyl isocyanurate, mixtures thereof, partial polymerization products prepared therefrom, and the like. In one preferred embodiment of the invention, the allylic monomer is triallyl isocyanurate.

The composition may generally comprise about 1 to about 60 percent by weight of the unsaturated monomer of the curable composition. In some embodiments of the invention, the unsaturated monomer is present in the composition in an amount of about 10 to about 60 percent by weight (e.g., about 10 to about 40 percent by weight, about 10 to about 35 percent by weight, about 15 to about 25 percent by weight, or about 15 to about 20 percent by weight) of the curable composition. Within the above ranges, the unsaturated monomer amount may specifically be at least about 5, 10, 15, 16, 17, 18, 19, 20 or about 25 percent by weight of the composition. In a preferred embodiment, the unsaturated monomer is about 18 or 19 percent by weight of the composition.

In some embodiments, the weight ratio between the poly (phenylene ether) and the unsaturated monomer in the curable composition can be at most about 2:1 (e.g., at most about 1.5:1, at most 1.25:1, or at most about 1:1).

The curable composition may, optionally, further comprise a curing initiator to, e.g., initiate the polymerization, curing or crosslinking of the components of the composition. The curing initiator may include any compound capable of producing free radicals at elevated temperatures. Such curing initiators may include both peroxy and non-peroxy based radical initiators. The curing initiator can include a single component or a mixture of components. Examples of useful peroxy initiators include, for example, benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5-dimethylhexane-2,5-dihydroperoxide, 2,5-dimethyl-2,5-di(t-butylperoxy)-hex-3-yne, di-t-butylperoxide, t-butylcumyl peroxide, α,α'-bis(t-butylperoxy-m-isopropyl)benzene, 2,5-dimethyl-2,5-di(t-butylperoxy)hexane, di(t-butylperoxy) isophthalate, t-butylperoxy benzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, trimethylsilylphenyltriphenylsilyl peroxide, and the like, and mixtures thereof. Suitable non-peroxy initiators include, for example, 2,3-dimethyl-2,3-diphenylbutane, 2,3-trimethylsilyloxy-2,3-diphenylbutane, and the like, and mixtures thereof. In one embodiment of the invention, the curing initiator is a peroxy curing initiator. In another preferred embodiment, the curing initiator is 2,5-dimethylhexane-2,5-dihydroperoxide. In another preferred embodiment, the curing initiator is 2,5-dimethyl2, 5-di(t-butylperoxy)-hex-3-yne, available as the commercial product DYBP (United Initiators). In another preferred embodiment, the catalyst is 45% 2,5-dimethyl-2,5-di(t-butylperoxy)-hex-3-yne which is dispersed onto a calcium carbonate and silica mixture, available as the commercial product DYBP-45-IC2 (United Initiators). In another preferred embodiment, the curing initiator is 2,5-dimethyl-2,5-di(t-butylperoxy)-hexane, available as the commercial product DHBP (United Initiators).

The curing initiators may be used in their pure form or in a mixture with carrier compounds, such as calcium carbonate, calcium sulfate, or silica. The concentration of the initiators in the mixture can range from about 10 to about 90 percent by weight.

The curing initiator (e.g., an initiator containing one peroxide or a mixture of peroxides) may be used in the composition at about 0 to about 10 percent by weight of the composition. In one embodiment of the invention, the curing initiator is present in an amount of about 0 to about 4 percent by weight. In another embodiment, the curing initiator is present in an amount of about 0 to about 2 percent by weight. In some embodiments, the curing initiator is present in an amount of about 0.1 to about 5 percent by weight (e.g., about 0.1 to about 3 percent by weight) of the composition. Within this range, the curing initiator amount may be at least about 0.2 percent by weight. Also within this range, the curing initiator amount may be about 0.25, 0.3, 0.4, 0.5, 0.6, 0.65, 0.7, 0.75, 0.8, 0.9, or up to about 3 percent by weight. In a preferred embodiment, about 0.4, 0.7, or 0.75 percent by weight of the composition comprises a curing initiator.

In some embodiments, the curing initiator is present in an amount of about 0.1 to about 0.5 percent by weight (e.g., about 0.2 to about 0.4 percent by weight or about 0.3 to about 0.4 percent by weight) of the composition. Without wishing to be bound by theory, it is believed that a curable composition containing a relatively small amount of initiator (e.g., within the above ranges) results in a pre-preg or laminate having surprisingly improved dielectric properties (e.g., low Df values).

Optionally, the curable composition may further comprise one or more fillers. Examples of such fillers are well known in the art. Non-limiting examples of fillers include silica powder, such as fused silica and crystalline silica, boron-nitride, alumina, and magnesium oxide (or magnesia). Other fillers of the invention include calcium sulfate, calcium carbonate, talc, glass spheres, kaolin, clay, mica, silicate spheres, cenospheres, aluminosilicate, sand, quartz, quartzite, perlite, and synthetic silica, including those with various silane coatings, and the like. The fillers may be present in the composition at a range of about 1 to about 50 percent by weight (e.g., about 10 to about 50 percent by weight, about 15 to about 50 percent by weight, about 20 to about 45 percent by weight, about 35 to about 50 percent by weight, about 35 to about 45 percent by weight, or about 38 to about 42 percent by weight) the composition. For example, in one embodiment of the invention, the filler is present in an amount of about 10 to about 40 percent by weight. In another embodiment, the filler is present in an amount of about 15 to about 35 percent by weight. In one preferred embodiment, the filler is present at about 25 or 40 percent by weight.

The composition may optionally contain adhesion promoters to improve adhesion of the thermosetting resin to the filler or to an external coating or substrate. Adhesion promoters include chromium complexes, silanes, titanates, zirco-aluminates, propylene maleic anhydride copolymers, styrene maleic anhydride copolymers, reactive cellulose esters and the like. The adhesion promoter may be included in the thermosetting resin itself, or coated onto any of the fillers described above to improve adhesion between the filler and the thermosetting resin. For example, such promoters may be used to coat a glass fiber or silica filler to improve adhesion of the resin matrix. The adhesion promoter may be present in the composition in an amount of about 0 to about 1 percent by weight of the composition. In one embodiment of the invention, the adhesion promoter is present in an amount of about 0.05 to about 0.5 percent by weight. In another embodiment of the invention, the adhesion promoter is present in an amount of about 0.1 to about 0.3 percent by weight (e.g., about 0.2 to about 0.3 percent by weight). In another embodiment, the adhesion promoter is present in an amount of about 0.1, 0.2, 0.25, 0.3, 0.4, or 0.5 percent by weight of the composition. In a preferred embodiment, the adhesion promoter is present in an amount of about 0.2 or 0.25 percent by weight.

The compositions of the invention may be dissolved in an effective amount of an inert solvent. Suitable solvents include solvents that are capable of being removed by means such as evaporation. Solvents such as methyl ethyl ketone and cyclohexanone are preferred. Solvents of the invention also include hydrocarbon type solvents such as toluene and xylene. Other ketone-type solvents such as methyl isobutyl ketone, and cyclopentanone are also useful.

The poly(phenylene ether) composition may, optionally, further comprise one or more additives known in the art such as, e.g., dyes, pigments, colorants, antioxidant, heat stabilizers, ion scavengers, adhesion promoters, plasticizers, lubricants, flow modifiers, antiblocking agents, and the like, and combinations thereof. Those skilled in the art may select suitable additives and determine suitable amounts of the additive reagent without undue experimentation.

In some embodiments of the invention, a method is provided for forming the curable composition, by blending a poly(phenylene ether) and any of the above-described components of the composition at a temperature in the range of 10 to 50° C. to provide a blend.

Another embodiment is a cured composition obtained by curing any of the above-described curable compositions. It will be understood that the term "curing" includes partially curing and fully curing. Because the components of the curable composition may react with each other during curing, the cured compositions may be described as comprising the reaction products of the curable composition components. The curable compositions of the present invention are typically cured at a temperature of between about 150 and 250° C. For example, in one embodiment of the invention, the curable compositions of the invention are cured at a temperature of 160 to 230° C. In another embodiment, the composition is cured at a temperature of about 175 to about 220° C. In another embodiment, the composition is cured at a temperature of 216° C. A preferred curing temperature is from 190 to about 220° C.

In some embodiments, the invention further pertains to prepregs for use in the electronics industry incorporating the curable compositions of the present invention. Prepregs for use in the electronics industry (particularly for printed wiring or circuit boards) are generally produced by impregnating a supporting or reinforcing material (usually based on glass fibers, either as a woven or nonwoven fabric or in the form of across-ply laminate of unidirectionally oriented parallel filaments) with a curable composition, followed by the curable composition being cured wholly or in part. The latter process is the most common one, and a fabric impregnated with a partially cured resin is usually referred to as a "prepreg." To make a printed wiring board from a prepreg fabric, one or more layers of the prepreg are laminated with, for example, one or more layers of copper.

As the base material of woven fabric or non-woven fabric used in the prepreg of the present invention, there may be used natural fiber base materials such as paper or cotton linter; organic synthetic fiber base materials such as Aramid, polyvinyl alcohol, polyester or acrylic fiber, and inorganic fiber base materials such as glass and asbestos. A glass fiber base material is preferable from the viewpoint of flame resistance. Examples of the glass fiber base materials include, but are not limited to, woven fabric using E glass, NE glass (from Nittobo, Japan), C glass, D glass, S glass, L glass, or Quartz, glass non-woven fabric in which short fibers are adhered into a sheet-like material with an organic binder, and further those in which glass fiber and other fiber types are mixed and made fabric.

According to the present invention, a prepreg can be produced by impregnating the above curable composition into a base material such as a woven or non-woven fabric followed by drying to remove solvent and, optionally, partially curing. The resulting prepreg maybe laminated with one or more layers as necessary to make a composite structure, and after application of a metal foil such as copper foil or aluminum foil to either or both surfaces of the structure, may be subjected to pressurization and hot pressing to obtain a metal clad laminated board.

According to the present invention, a printed circuit or wiring board can be obtained by performing circuit processing on the metal foil of the metal foil clad laminated board. Circuit processing can be carried out by, for example, forming a resist pattern on the surface of the metal foil, removing unnecessary portions of the foil by etching, removing the resist pattern, forming the required through holes by drilling, again forming the resist pattern, plating to connect the through holes, and finally removing the resist pattern. A multi-layer printed circuit or wiring board can be obtained by further laminating additional prepregs and metal foil layers with the metal foil clad laminated board obtained in the above manner under the same conditions as described above, followed by performing circuit processing in the same manner as described above. In this case, it is not always necessary to form through holes, and via holes may be formed in their place, or both may be formed. This process can be repeated such that the laminated boards are sequentially laminated the required number of times to produce the desired multilayer laminate structure.

The printed circuit or wiring board produced in the above manner can be laminated with metal foil provided with adhesive on one surface or both surfaces in the form of an inner layer circuit board. This lamination molding is normally performed under heating and pressurization. Examples of metal foil include copper foil and aluminum foil. A multi-layer printed circuit board can then be obtained by performing circuit processing in the same manner as described above on the resulting metal foil clad laminated board.

The formulation of the present invention is also compatible with electroless nickel immersion gold (ENIG) applications. Electrolesss nickel immersion gold is a type of surface plating used for printed circuit boards, consisting of electroless nickel plating covered with a thin layer of immersion gold which protects the nickel from oxidation. Electroless nickel immersion gold surface plating provides improved hardness, wear resistance, corrosion resistance, minimal magnetic properties and high deposit uniformity.

The invention is further illustrated by the following non-limiting examples.

Example 1

A curable composition (i.e., Composition 1) was prepared by dissolving poly(phenylene ether) resin MX9000-111 (37.5 lbs) (Sabic), triallylisocyanurate (DIAK #7; DuPont) (19 lbs), 2,5-dimethyl-2,5-di(tertbutylperoxy)-hex-3-yne (0.67 lbs) (DYBP United Initiators) and OFS-6030 (0.25 lbs) (Xiameter) in a solvent solution containing methyl ethyl ketone (60 lbs). 1,1'(ethane-1,2-diyl)bis[pentabromobenzene] Saytex 8010 (18 lbs) and silica filler SC-2500-SVJ (25 lbs) (Admatechs, Japan) was added and dispersed into the resin solution using high shear mixing under ambient conditions. Composition 1 was then used to impregnate a piece of E glass and cured to form a laminate.

The curable composition prepared in this example exhibited improved properties when tested using standard Interconnect Stress Testing (IST) and Conductive Anodic Filament (CAF) Test procedures.

The IST coupon was prepared using a 20 layer design with a 0.120" overall thickness. The coupon was preconditioned at 260° C. 6 times before testing. Each testing cycle was conducted at a temperature of 25 to 150° C. The coupon passed 1000 test cycles.

CAF tests were conducted using coupons prepared using the curable composition described above. In the CAF tests, the coupons were constructed as 26-layer boards with a 0.130" thickness, using 1035, 1080, 3313, and 2116 glass with H/H and 1 1 oz inner layer. The coupon was 4"×7.1" in size. The coupon technology consisted of a quad array containing a 0.8 mm pitch/0.010" drill; 0.8 mm pitch/0.012" drill; 1.0 mm pitch/0.010" drill; and 1.0 mm pitch/0.012" drill; with 13,400 total drilled holes per array (~3,350 opportunities for each technology pair). The coupons were reflowed 6×260° C. before testing. The samples were then tested at 50° C./80% RH/15V Bias for 600 hours with an initial 96 hour stabilization period. 100% of the samples tested passed CAF testing.

Comparative Examples 1-3

Three comparison samples were formulated and were used to make laminates in the same manner as described in Example 1. However, in the comparative samples, Saytex 8010 was replaced with BC58™ (Great Lakes Chemical Corporation), Exolit OP 930® (Clariant), or Saytex® BT-93 (Albemarle Corporation), as shown in Table 1. BC-58™ is a brominated, aromatic flame retardant. Exolit OP930® is a fine-grained powder flame retardant based on an organic phosphinate. Saytex® BT-93 is a brominated flame retardant of the structure ethylene-1,2-bis(tetrabromophthalimide). Laminate testing was performed according to IPC 4101 industry standard methods. Pressure cooker solder dip testing was performed using standard methods. In particular, for pressure cooker solder dip studies, samples were placed in a pressure cooker apparatus and heated under elevated pressure (15 psi). Samples were then placed in molten solder and time to failure values were evaluated.

The properties of the resulting laminates are shown in Table 1. The Dk or Df values in Table 1 represent data generated after the specimen is dried and then conditioned for 16 hours at room temperature at 50% RH.

TABLE 1

| Test Description | Parameters | Example 1 (Saytex 8010) | Comp. Ex. 1 BC-58 | Comp. Ex. 2 OP 930 | Comp. Ex. 3 BT-93 |
|---|---|---|---|---|---|
| Press Cycle | Cure temp, ° F./dwell time, min/heat up rate ° F./min/pressure | 30/350/3 + 60/ 420/6° F./250 psi | 30/350/3 + 60/ 420/3/300 psi | 30/350/3 + 60/ 420/3/200 psi | 30/350/3 + 60/ 420/3/250 psi |
| Dk/Df @10 | Dk | 3.93 | 3.81 | 3.72 | 3.88 |

TABLE 1-continued

| Test Description | Parameters | Example 1 (Saytex 8010) | Comp. Ex. 1 BC-58 | Comp. Ex. 2 OP 930 | Comp. Ex. 3 BT-93 |
|---|---|---|---|---|---|
| GHz [Split Post Cavity Method 2-2116] | Df | 0.0064 | 0.0060 | 0.0056 | 0.0060 |
| DMA Tg (° C.) | Tan Delta | 273 | 239 | 260 | 262 |
| TMA(° C.) 8-7628 | Tg ° C. | 233 | 198 | 222 | 228 |
| | Alpha 1 Z-CTE (50° C. to Tg −5° C.) | 45 | 44 | 39 | 40 |
| | Alpha 2 Z-CTE (Tg +5° C. to 260° C.) | 180 | 261 | 230 | 229 |
| | Overall Z-CTE (50° C. to 260° C.) | 1.4% | 2.4% | 1.9% | 1.6% |
| T-300 | Time to failure (minutes) | >120 | 3 | >120 | >120 |
| Copper Peel Test 8-7628(lb/in) | WG lbs/in | 6.19 | not available | 3.34 | 7.02 |
| | XG lbs/in | 6.57 | 5.71 | 4.4 | 6.53 |
| Interlaminar Bond Strength 2-7628 (lb/in) | WG lbs/in | 4.79 | 5.72 | 2.32 | 1.38 |
| | XG lbs/in | 5.28 | 6.5 | 2.91 | 2.28 |
| Pressure Cooker Solder Dip (PCSD) | Time to failure (seconds) | >600 | >600 | 450 | >600 |
| | % wt gain | 0.18% | 0.15% | 0.22% | 0.16% |
| 550° F. 4" × 4" SOLDER FLOAT BLISTER | Range (seconds) | all >600 | all >600 | 600/150/600 | all >600 |
| | Average of 3 Samples (seconds) | >600 | 339 | >600 | >600 |
| Flammability (UL94) | Total burn time (5 samples) (seconds) | 0 | 11 | 11 | 10 |
| | UL94 rating | V-0 | V-0 | V-0 | V-0 |

The above tabulated data reveals that laminates prepared with the curable composition in Example 1 have overall improved properties including, for example, a high interlaminar bond strength, high thermal stability, and high Tg values. Such properties are of importance for printed circuit board applications.

Comparative Examples 4-6

Three comparison samples were formulated and were used to make laminates in the same manner as described in Example 1. However, in the comparative samples, Saytex 8010 was replaced with PX-200 (Daihachi Chemical Industry Co.), BR-30 (Kowa), or DER560 (Dow), as shown in Table 2. PX-200 is a condensed phosphate ester-based flame retardant. BR-30 is a brominated flame retardant comprising the compound tribromophenyl acrylate. DER560 is a brominated diglycidyl ether of bisphenol-A. Laminate testing was performed according to IPC 4101 industry standard methods. Pressure cooker solder dip testing was performed using standard methods. In particular, for pressure cooker solder dip studies, samples were placed in a pressure cooker apparatus and heated under elevated pressure (15 psi). Samples were then placed in molten solder and time to failure values were evaluated.

The properties of the resulting laminates are shown in Table 2. The Dk or Df values in Table 2 represent data generated after the specimen is dried and then conditioned for 16 hours at room temperature at 50% RH.

TABLE 2

| Test Description | Parameters | Example 1 (Saytex 8010) | Comp. Ex. 4 PX-200 | Comp. Ex. 5 BR-30 | Comp. Ex. 6 DER560 |
|---|---|---|---|---|---|
| Press Cycle | Cure temp, ° F./dwell time, min/heat up rate ° F./min/pressure | 30/350/3 + 60/ 420/6° F./250 psi | 30/350/3 + 60/ 420/6/250 psi | 30/350/3 + 60/ 420/3/200 PSI | 30/350/3 + 60/ 420/3/200 PSI |
| Dk/Df @10 GHz [Split Post Cavity method], 2-2116 | Dk | 3.93 | 4.01 | 3.92 | 3.95 |
| | Df | 0.0064 | 0.0052 | 0.0051 | 0.0138 |
| | Resin Content | 58.1% | 49.6% | 57.4% | 56.4% |
| DMA Tg (° C.) | Tan Delta | 273 | 184 | 235 | 202 |
| TMA(° C.) 8-7628 | Tg ° C. | 233 | 131 | 210 | 145 |
| | Alpha 1 Z-CTE (50° C. to Tg −5° C.) | 45 | 79 | 43 | 46 |

TABLE 2-continued

| Test Description | Parameters | Example 1 (Saytex 8010) | Comp. Ex. 4 PX-200 | Comp. Ex. 5 BR-30 | Comp. Ex. 6 DER560 |
|---|---|---|---|---|---|
| | Alpha 2 Z-CTE (Tg +5° C. to 260° C.) | 188 | 304 | 253 | 222 |
| | Overall Z-CTE (50° C. to 260° C.) | 1.4% | 4.5% | 2.1% | 3.0% |
| T-300 | Time to failure (minutes) | >120 | >120 | 16 | 13 |
| Copper Peel Strenth , (lb/in) 8-7628 | WG lbs/in | 6.19 | 6.44 | 9.48 | 9.12 |
| | XG lbs/in | 6.57 | 6.08 | 9.09 | 8.63 |
| Interlaminar Bond Strength 2-7628 (lb/in) | WG lbs/in | 4.79 | 7.24 | 6.08 | 4.37 |
| | XG lbs/in | 5.28 | 8.97 | 7.01 | 5.54 |
| Pressure Cooker Solder Dip 8-7628 [etched] | Average of 3 Samples (seconds) | >600 | >600 | >600 | >600 |
| | % wt gain | 0.18% | 0.12% | 0.11% | 0.32% |
| | Range | all >600 | all >600 | all >600 | all >600 |
| SOLDER FLOAT BLISTER | Average of 3 Samples (seconds) | >600 | >600 | >600 | >600 |
| Flammability (UL94) | Total burn time (5 samples) (seconds) | 0 | 182 | 10 | 14 |
| | UL94 rating | V-0 | FAIL | V-0 | V-0 |

The above tabulated data reveals that laminates prepared with the curable composition in Example 1, have overall improved properties including, for example, a high interlaminar bond strength, high thermal stability, and high Tg values. These properties are of importance for manufacture of pre-pregs, laminate structures, and for pre-pregs that are for use in printed circuit board applications.

Example 2

A second curable composition (i.e., Composition 2) was formulated and was used to make a laminate in the same way as described in Example 1. However, DIAK #7 was replaced with CVD50106 (Cray Valley, Exton, Pa.) and LDC-17 was replaced with SC-2500-SVJ (Admatechs, Tokyo, Japan). In addition, a second radical initiator, dicumyl peroxide (DCP), was added to Composition 2. Lastly, the amounts of the components in Composition 2 were different from those in Composition 1. The components and their amounts of Composition 2 are summarized in Table 3 below. The properties of this composition are summarized in Table 4 below.

TABLE 3

| Composition 2 | | % by weight |
|---|---|---|
| MX9000-111 | PPE resin | 28.04 |
| CVD50106 | TAIC | 28.04 |
| Luperox 130XL45 (containing 45 wt % DYBP and 55 wt % carrier) | curing initiator | 0.35 |
| DCP | curing initiator | 0.25 |
| SC-2500-SVJ | Silica | 25.04 |
| Saytex 8010 | Flame retardant | 18.03 |
| OFS-6030 | Silane | 0.25 |
| MEK | Solvent | 60 |

TABLE 4

| TEST DESCRIPTION | UNITS/ PARAMETERS | Composition 2 |
|---|---|---|
| SPC @10 GHz 2116 | Dk | 3.89 |
| | Df | 0.0046 |
| | % Resin Content | 58.00% |
| DMA Tg, ° C. | Tan Delta | 215 |
| TMA (° C.) 8-7628 | Tg° C. | 188 |
| | Alpha 1 Z-CTE (50° C. to Tg −5° C.) | 37 |
| | Alpha 2 Z-CTE (Tg +5° C. to 260° C.) | 199 |
| | overall Z-CTE (50° C. to 260° C.) | 2.00% |
| | >T300, min | 120+ |
| COPPER PEEL Strength (0.5 oz RTF) 8-7628 (W/F), lb/in | WG lbs/in | 3.92 |
| | XG lbs/in | 3.81 |
| Internal Method - Pressure Cooker Solder Dip (PCSD) 550° F. | Average of 3 Samples (seconds) | >600 sec |
| | wt gain | 0.18% |
| SOLDER FLOAT BLISTER | Range | >600 sec |
| | total time, sec [5 samples] | 0 |
| FLAMMABILITY | UL94 rating | V-0 |

As shown in Table 4, Composition 2 exhibited overall superior properties including, for example, high Tg values, low Dk values, low Df values, high thermal stability, high thermal resistance, and high hydrothermal stability. These properties are of importance for manufacture of pre-pregs, laminate structures, and for pre-pregs that are for use in printed circuit board applications. In addition, this composition exhibited superior multi-layer sequential lamination capability. Further, laminates made from this composition were found to pass IST and CAF testing requirements.

Examples 3-8

Six additional compositions (i.e., Compositions 3-8) were formulated and were used to make laminates in the same way as described in Example 1. The components and their amounts of Compositions 3-8 are summarized in Table 5 below. The properties are summarized in Table 6 below.

TABLE 5

| Formulation | | Comp. 3 | Comp. 4 | Comp. 5 | Comp. 6 | Comp. 7 | Comp. 8 |
|---|---|---|---|---|---|---|---|
| MX9000-111 | PPE resin | 40 | 37.5 | 37 | 37 | 26.93 | 25.55 |
| DIAK #7 | TAIC | 16.5 | 19 | 19 | 19 | 0 | 0 |
| CVD50106 | TAIC | 0 | 0 | 0 | 0 | 17.95 | 30.02 |
| DYBP | curing initiator | 0.25 | 0.25 | 0.58 | 0.67 | 0.21 | 0.25 |
| SC-2500-SVJ | Silica | 25 | 25 | 25 | 25 | 40.13 | 24.81 |
| Saytex 8010 | Flame retardant | 18 | 18 | 18 | 18 | 14.43 | 17.86 |
| OFS-6030 | Silane | 0.25 | 0.25 | 0.25 | 0.25 | 0.25 | 0.25 |
| MEK | Solvent | 50 | 36 | 60 | 44.5 | 60 | 60 |
| cyclohexanone | Solvent | 0 | 18 | 0 | 14.5 | 0 | 0 |
| DCP | curing initiator | 0 | 0 | 0 | 0 | 0.15 | 0.17 |

TABLE 6

| TEST DESCRIPTION | UNITS/ PARAMETERS | Comp. 3 | Comp. 4 | Comp. 5 | Comp. 6 | Comp. 7 | Comp. 8 |
|---|---|---|---|---|---|---|---|
| SPC @ 10 GHz 2116 | Dk | 3.75 | 3.95 | 3.91 | 3.89 | 4.09 | 3.88 |
| | Df | 0.0047 | 0.0049 | 0.0066 | 0.0059 | 0.0045 | 0.0048 |
| | % Resin Content | 57.70% | 56.70% | 56.80% | 60.20% | 58% | 59% |
| DMA Tg, ° C. | Tan Delta | 220 | 187 | 269 | 267 | 225 | 213 |
| TMA (° C.) 8-7628 | Tg ° C. | 192 | 147 | 230 | 233 | 185 | 175 |
| | Alpha 1 Z-CTE (50° C. to Tg −5° C.) | 55 | 54 | 51 | 40 | 30 | 53 |
| | Alpha 2 Z-CTE (Tg +5° C. to 260° C.) | 327 | 292 | 235 | 220 | 214 | 238 |
| | overall Z-CTE (50° C. to 260° C.) | 2.80% | 3.50% | 1.70% | 1.50% | 2% | 2.36% |
| | T300, min | >120 | >120 | >120 | >120 | >120 | >120 |
| COPPER PEEL STRENGTH (0.5 oz RTF) 8-7628 (W/F), lb/in | WG lbs/in | n/a | 7.2 | 230 | 6.09 | 5.35 | 4.3 |
| | XG lbs/in | n/a | 6.96 | 5.54 | 6.23 | 5.28 | 4.5 |
| Internal Method - Pressure Cooker Solder Dip (PCSD) 550° F. | Average of 3 Samples (seconds) | n/a | >600 sec | >600 sec | >600 sec | >600 sec | >600 sec |
| | wt gain | n/a | 0.10% | 0.18% | 0.18% | 0.14 | 0.15% |
| SOLDER FLOAT BLISTER | Range | n/a | >500 sec | >500 sec | >600 sec | >600 sec | >600 sec |
| | total time, sec [5 samples] | n/a | 9 | 0 | 10 | 0 | 0 |
| FLAMMABILITY | UL94 rating | n/a | V-0 | V-0 | V-0 | V-0 | V-0 |

As shown in Table 6, Compositions 3-8 exhibited superior overall properties including, for example, high Tg values, low Dk values, low Df values, and high thermal stability. These properties are of importance for manufacture of pre-pregs, laminate structures, and for pre-pregs that are for use in printed circuit board applications. In particular, compositions 3, 4, 7 and 8 (which contained from 0.2 to 0.5 percent by weight of one or more initiators) surprisingly exhibited lower Df values than compositions 5 and 6 (which contained at least 0.58 percent by weight of an initiator).

As is well known to those of ordinary skill in the art, formulations having excellent properties over a range of parameters are highly desirable. It is also known in the art that it is relatively easy to improve one property in a formulation but getting a product having desirable properties across a range of different parameters is difficult to achieve. Therefore, the compositions of the present invention, which offer general improvements over several parameters, including high interlaminar bond strength, high thermal stability, and high Tg values, represent a marked improvement over prior compositions.

The invention claimed is:
1. A curable composition, comprising:
a functionalized poly(phenylene ether) having the structure:

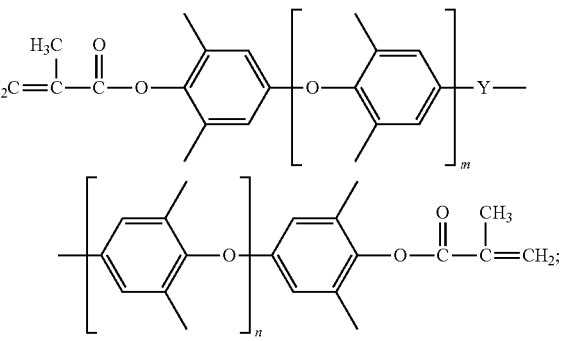

a radical initiator, the radical initiator being from about 0.1% to about 0.5% by weight of the composition;
an unsaturated monomer; and
a flame retardant comprising 1,1'(ethane-1,2-diyl)bis[pentabromobenzene],
wherein Y is absent or has the structure:

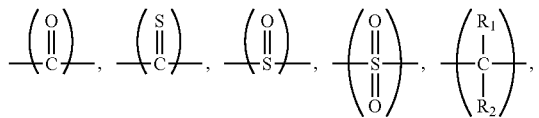

where $R_1$ and $R_2$ are each independently hydrogen or $C_1$-$C_{12}$ alkyl, and m and n are independently 1 to about 100.

2. The composition of claim 1, wherein the radical initiator comprises 2,5-dimethyl-2,5-di(t-butylperoxy)-hex-3-yne.

3. The composition of claim 2, wherein the radical initiator further comprises dicumyl peroxide.

4. The composition of claim 1, wherein the composition comprises from 0.2% to 0.4% by weight of the radical initiator.

5. The composition of claim 1, wherein the composition comprises from 0.3% to 0.4% by weight of the radical initiator.

6. The composition of claim 1, wherein Y is absent.

7. The composition of claim 1, wherein the composition comprises from 10% to about 40% by weight of the poly(phenylene ether).

8. The composition of claim 1, wherein the unsaturated monomer comprises triallyl isocyanurate.

9. The composition of claim 1, wherein the composition comprises from about 10% to 40% by weight of the unsaturated monomer.

10. The composition of claim 1, wherein the composition comprises from about 5% to about 50% by weight of the flame retardant.

11. The composition of claim 1, further comprising a silica filler.

12. The composition of claim 11, wherein the composition comprises from about 1% to about 50% by weight of the silica filler.

13. The composition of claim 1, further comprising an adhesion promoter, the adhesion promoter comprising a silane.

14. The composition of claim 13, wherein the silane is from about 0.05% to about 0.5% by weight of the composition.

15. A woven or non-woven fabric impregnated with the composition of claim 1.

16. A laminate, comprising at least one layer of the fabric of claim 15.

17. The laminate of claim 16, further comprising at least one layer of a metal foil on a surface of the at least one layer of the fabric.

18. The laminate of claim 17, wherein the metal foil is a copper foil.

19. A circuit board for use in an electronic product, comprising the fabric of claim 14.

20. A method, comprising:
impregnating a woven or non-woven web with the composition of claim 1 to form a pre-preg product.

21. The method of claim 20, further comprising curing the curable composition to form a laminated product.

22. The method of claim 21, wherein the method comprises curing the curable composition at a temperature between about 150° C. and 250° C.

* * * * *